(12) United States Patent
Jin

(10) Patent No.: US 8,816,475 B2
(45) Date of Patent: Aug. 26, 2014

(54) SEMICONDUCTOR DEVICES INCLUDING CAPACITORS AND METHODS OF MANUFACTURING THE SAME

(75) Inventor: Hyung Ju Jin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 133 days.

(21) Appl. No.: 13/588,016

(22) Filed: Aug. 17, 2012

(65) Prior Publication Data

US 2013/0207232 A1    Aug. 15, 2013

(30) Foreign Application Priority Data

Feb. 13, 2012    (KR) .......................... 10-2012-0014458

(51) Int. Cl.
*H01L 21/02* (2006.01)

(52) U.S. Cl.
USPC .......................................... 257/534; 438/396

(58) Field of Classification Search
USPC .................. 257/338, 308–309, 311, E21.646, 257/E21.647, E29.002, E21.008; 438/252–255, 396–398

See application file for complete search history.

(56) References Cited

U.S. PATENT DOCUMENTS 8,134,195 B2 *   3/2012   Lee et al. ...................... 257/304

FOREIGN PATENT DOCUMENTS

| KR | 1019970018745 A | 4/1997 |
| KR | 100532420 B1 | 11/2005 |
| KR | 1020100008941 A | 1/2010 |

* cited by examiner

*Primary Examiner* — Julio J Maldonado
*Assistant Examiner* — Robert Bachner
(74) *Attorney, Agent, or Firm* — William Park & Associates Patent Ltd.

(57) ABSTRACT

Semiconductor devices having capacitors are provided. The semiconductor device includes spiral storage nodes disposed on a semiconductor substrate to vertically extend along spiral lines, a dielectric layer on the spiral storage nodes, and a plate node formed on the dielectric layer of the spiral storage nodes.

8 Claims, 12 Drawing Sheets

SEMICONDUCTOR DEVICES INCLUDING CAPACITORS AND METHODS OF MANUFACTURING THE SAME

CROSS-REFERENCES TO RELATED APPLICATIONS

The present application claims priority under 35 U.S.C 119(a) to Korean Application No. 10-2012-0014458, filed on Feb. 13, 2012, in the Korean Intellectual Property Office, which is incorporated herein by reference in its entirety as set forth in full.

BACKGROUND

1. Field of the Invention

Embodiments of the present disclosure relate to semiconductor devices and methods of manufacturing the same and, more particularly, to semiconductor devices including capacitors and methods of manufacturing the same.

2. Description of the Related Art

As semiconductor devices such as dynamic random access memory (DRAM) devices become more highly integrated and more compact, DRAM technologies have been continuously developed to realize a minimum feature size of about 20 nanometers or less. Attempts to increase the integration density of the DRAM devices including cell capacitors have typically resulted in the reduction of areas (planar areas) that the cell capacitors occupy. Thus, efforts to increase capacitance of the cell capacitors in a limited area have been continuously required to realize high performance DRAM devices.

In order to increase the capacitance of the cell capacitors in a limited area, a height of storage nodes of the cell capacitors may be increased. However, when the height of the storage nodes increases, a step difference between a cell array region and a peripheral circuit region may also increase which may cause difficulties in subsequent processes. For example, if the step difference between the cell array region and the peripheral circuit region increases, a planarization process may be required to obtain a smooth surface profile and the planarization process may increase a thickness of an interlayer insulation layer in the peripheral circuit region. Accordingly, there may be some difficulties in forming through holes penetrating the interlayer insulation layer in the peripheral circuit region.

Recently, cylindrical storage nodes have been used to increase the capacitance of the cell capacitors. Nevertheless, there may be some limitations in realizing high performance capacitors using cylindrical storage nodes. Thus, technologies for realizing the high performance capacitors may be still required.

SUMMARY

Embodiments are directed to semiconductor devices including capacitors and methods of manufacturing the same.

According to some embodiments, a semiconductor device includes spiral storage nodes disposed on a semiconductor substrate to vertically extend along spiral lines, a dielectric layer on the spiral storage nodes, and a plate node formed on the dielectric layer of the spiral storage nodes.

According other embodiments, a semiconductor device includes spiral storage nodes on a semiconductor substrate, a dielectric layer on the spiral storage nodes, and a plate node formed on the dielectric layer of the spiral storage nodes. Each of the spiral storage nodes includes a plurality of node stairs stacked along an imaginary spiral line vertically extending from a surface of the semiconductor substrate.

According other embodiments, a method of manufacturing a semiconductor device includes forming spiral storage nodes on a semiconductor substrate, forming a dielectric layer on the spiral storage nodes, and forming a plate node on the dielectric layer of the spiral storage nodes. Each of the spiral storage nodes is formed to include a plurality of node stairs stacked along an imaginary spiral line vertically extending from a surface of the semiconductor substrate.

According other embodiments, a method of manufacturing a semiconductor device includes forming spiral storage nodes on a semiconductor substrate to vertically extend along spiral lines, forming a dielectric layer on the spiral storage nodes, and forming a plate node on the dielectric layer of the spiral storage nodes.

BRIEF DESCRIPTION OF THE DRAWINGS

Embodiments of the inventive concept will become more apparent in view of the attached drawings and accompanying detailed description in which.

DETAILED DESCRIPTION OF THE EMBODIMENTS

Figure 1:
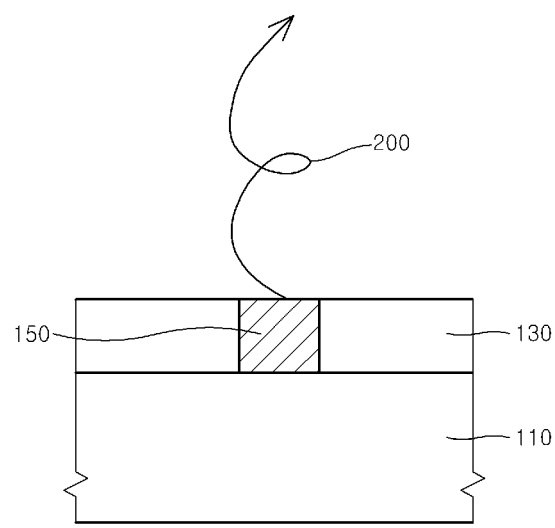
FIGS. 1 and 2 are drawings illustrating a storage node of a capacitor of a semiconductor device according to an embodiment.

Embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough, and will convey a scope of the disclosure to those skilled in the art. In the drawings, the sizes and relative sizes of layers and regions may be exaggerated for clarity. The same reference numerals or the same reference designators denote the same elements throughout the specification.

Embodiments are described herein with reference to plan views, perspective views and cross-section views that are schematic illustrations of embodiments (and intermediate structures). As such, variations from the shapes of the illustrations as a result, for example, of manufacturing techniques and/or tolerances, are to be expected. Thus, the disclosed embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including,"

when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The following example embodiments disclose storage nodes having a spiral pillar shape. In some embodiments, each of the storage nodes may include a plurality of pieces which are vertically stacked along a spiral line. Accordingly, a surface area of each of the storage nodes may be increased in a limited planar area without increasing the height of the storage nodes, thereby improving performance of capacitors including the storage nodes. That is, the example embodiments may provide semiconductor devices including three dimensional spiral storage nodes that constitute capacitors and methods of manufacturing the same.

Figure 2:
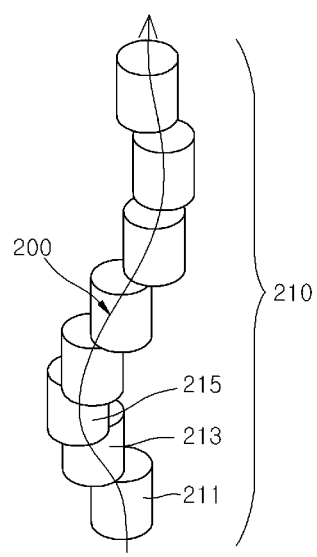

FIG. 1 is a schematic cross sectional view illustrating a storage node constituting a capacitor of a semiconductor device according to an example embodiment, and FIG. 2 is a perspective view illustrating a storage node constituting a capacitor of a semiconductor device according to another example embodiment.

Referring to FIG. 1, a storage node upwardly extending along a spiral line 200 may be provided on a semiconductor substrate 110 to increase capacitance of a cell capacitor of a semiconductor device, for example, a dynamic random access (DRAM) device. As illustrated in FIG. 2, the storage node 210 may have a stepped spiral pillar shape including a plurality of node stairs 211, 213 and 215 that are vertically stacked along the spiral line 200. The node stairs 211, 213 and 215 may correspond to sub-nodes constituting the storage node 210, and central points of the node stairs 211, 213, and 215 may be located on the spiral line 200. Thus, the storage node 210 exhibits a spiral shape, but also partly a step shape. That is, the storage node 210 may have a twisted structure extending along the spiral line 200.

Referring again to FIGS. 1 and 2, the plurality of node stairs 211, 213, and 215 may be twisted and stacked along the spiral line 200 on the semiconductor substrate 110, thereby constituting the stepped spiral storage node 210. A lower portion of the storage node 210 may be electrically connected to the semiconductor substrate 110 through a contact plug 150. Although not shown in the drawings, cell transistors constituting DRAM cells may be disposed in the semiconductor substrate 110. Each of the cell transistors may be formed to include a buried gate disposed in the semiconductor substrate 110, thereby contributing to the shrinkage of the DRAM device.

An interlayer insulation layer 130 may be disposed on the semiconductor substrate 110 including the cell transistors. The interlayer insulation layer 130 may include at least one of various insulation layers. For example, the interlayer insulation layer 130 may include a silicon oxide layer. The contact plug 150 may penetrate the interlayer insulation layer 130 to electrically connect a source region of any one of the cell transistors to the storage node 210. Interconnection lines such as bit lines (not shown) may be disposed in the interlayer insulation layer 130 and may be electrically connected to drain regions of the cell transistors. The contact plug 150 may be insulated from the bit lines and may be electrically connected to the source region of any one of the cell transistors. The interlayer insulation layer 130 may be disposed to electrically insulate the bit lines and the buried gates (e.g., word lines) from the storage node 210.

The contact plug 150 penetrating the interlayer insulation layer 130 may act as a storage node contact. The contact plug 150 may include one of various conductive materials, for example, at least one selected from the group consisting of a doped polysilicon layer and a metal layer (e.g., a tungsten layer or a titanium nitride layer). The contact plug 150 may be disposed at a position where the spiral storage node 210 is formed. That is, the spiral storage node 210 may be vertically disposed on the contact plug 150, and a dielectric layer and a plate node may be sequentially stacked on a surface of the spiral storage node 210. The spiral storage node 210, the dielectric layer and a plate node may constitute a cell capacitor.

Figure 11:
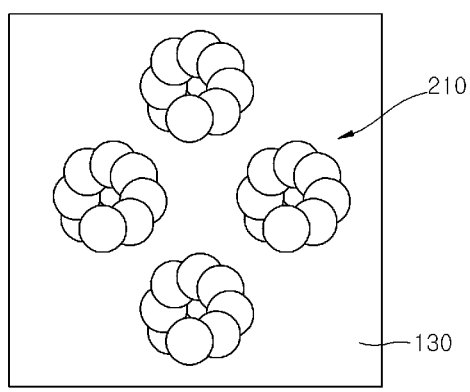
Figure 12:
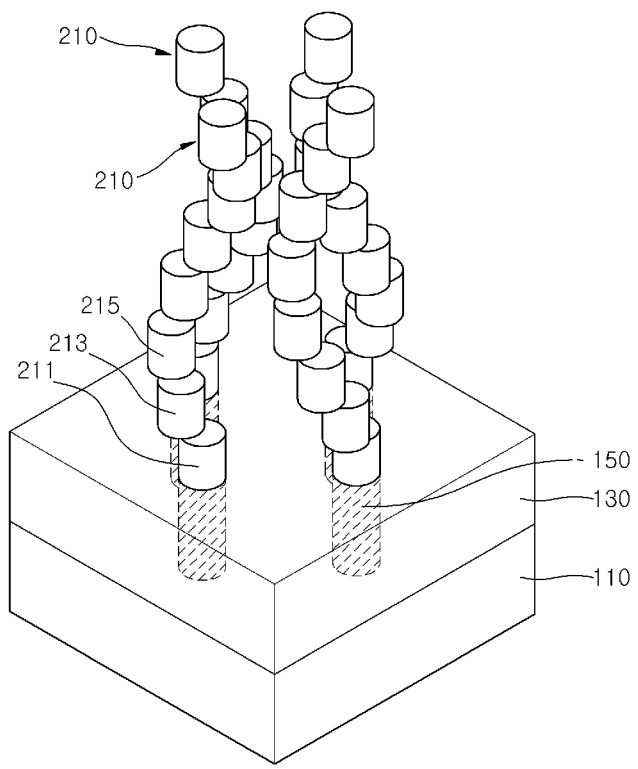
Figure 13:
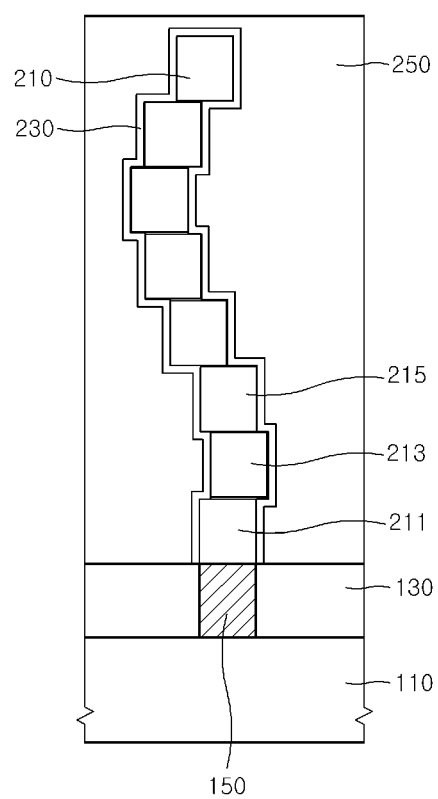

FIGS. 3 to 13 are drawings illustrating a method of manufacturing capacitors of a semiconductor device according to an example embodiment. FIGS. 3, 5, 7, 9 and 11 are plan views (i.e., views from above the semiconductor device) illustrating a method of manufacturing capacitors of a semiconductor device according to an embodiment, FIGS. 4, 6, 8, 10 and 12 are perspective views illustrating a method of manufacturing capacitors of a semiconductor device according to an embodiment, and FIG. 13 is a cross sectional view illustrating a method of manufacturing capacitors of a semiconductor device according to an embodiment.

Figure 3:
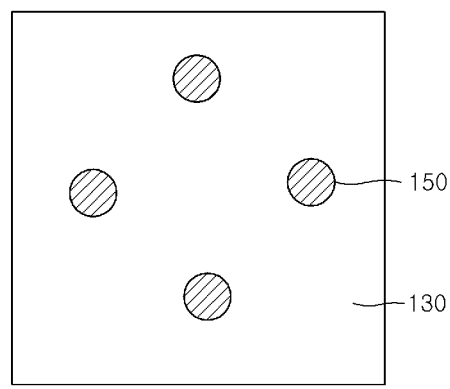
FIGS. 3 to 13 are drawings illustrating a method of manufacturing capacitors of a semiconductor device according to embodiments.
Figure 4:
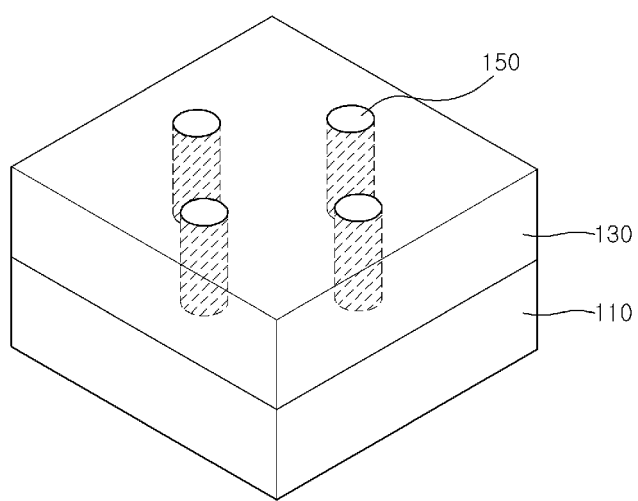

Referring to FIGS. 3 and 4, an interlayer insulation layer 130 may be formed on a semiconductor substrate 110, and contact plugs 150 may be formed to penetrate the interlayer insulation layer 130. The contact plugs 150 may act as storage node contacts. The contact plugs 150 may be formed to include a doped polysilicon layer or a metal layer (e.g., a tungsten layer or a titanium nitride layer). Cell transistors including buried gates acting as word lines may be formed in the semiconductor substrate 110. The cell transistors may constitute memory cells of a DRAM device. Interconnection lines, for example, bit lines may also be formed on the semiconductor substrate 110. The bit lines and the word lines may be formed to control read and write operations of the memory cells of the DRAM device. The interlayer insulation layer 130 may be formed of, for example, a silicon oxide layer to electrically insulate the interconnection lines such as the bit lines from each other. The cell transistors may be formed in the semiconductor substrate 110 before deposition of the interlayer insulation layer 130.

The contact plugs 150 may be formed by patterning the interlayer insulation layer 130 to form contact holes, depositing a conductive layer to fill the contact holes, and planarizing the conductive layer to expose a top surface of the interlayer insulation layer 130. In an embodiment, the conductive layer may be planarized using a chemical mechanical polishing (CMP) process.

Figure 5:
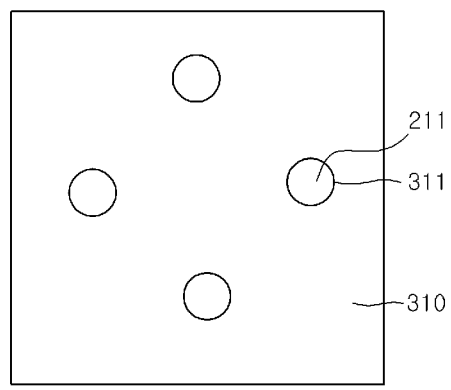
Figure 6:
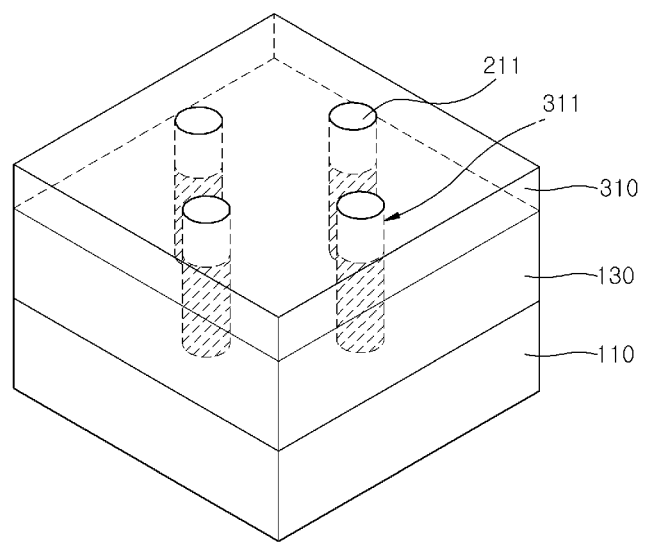

Referring to FIGS. 5 and 6, a first mold layer 310 may be formed on the interlayer insulation layer 130 and the contact plugs 150. The first mold layer 310 may be used as a sacrificial layer removed in a subsequent process. The first mold layer 310 may be formed of an insulation material, for example, a silicon oxide layer. In an embodiment, the first mold layer 310 may be formed to include a phosphosilicate glass (PSG) layer or a plasma-enhanced tetra-ethyl-othorsilicate (PE-TEOS) layer. The first mold layer 310 may be patterned using a lithography process and an etching process, thereby forming first through holes 311 exposing respective ones of the contact plugs 150. The first through holes 311 may be formed to be vertically aligned with the contact plugs 150, respectively.

A first conductive layer may be formed in the first through holes 311 and on the first mold layer 310. The first conductive layer may be formed to include a doped polysilicon layer. In some embodiments, the first conductive layer may be formed to include a metal layer, for example, a titanium nitride layer or a tungsten layer.

In some embodiments, the first conductive layer may be formed to include a combination of a metal layer and a conductive metal oxide layer. For example, the first conductive layer may be formed to include a combination of a tungsten nitride (WN) layer, a ruthenium (Ru) layer, a ruthenium oxide ($RuO_2$) layer, an iridium (Ir) layer, an iridium oxide ($IrO_2$) layer, a platinum (Pt) layer and a strontium ruthenium oxide ($SrRuO_3$) layer.

The first conductive layer may be planarized using a CMP process to expose a top surface of the first mold layer 310. As a result, first node stairs 211 connected to the contact plugs 150 may be formed in respective ones of the first through holes 311. Each of the first node stairs 211 may correspond to a sub node constituting the storage node (210 of FIG. 2). The first node stairs 211 may be located at a first level or height, and the second node stairs 215 may be located at a second level that is higher than the first level. A height of the first node stairs 211 may be determined in consideration of a twisted degree of the storage nodes, for example, a radius of the spiral line (200 of FIG. 1) in a plan view and a final height of the storage nodes. That is, the storage node 210 may be twisted and extended along the spiral line 200, as described with reference to FIGS. 1 and 2. Thus, the number of the stacked node stairs (211, 213, 215 . . . of FIG. 2) and a height of each node stair may be determined according to the radius (or a diameter) of the spiral line 200, in a plan view, and the final height of the storage nodes 210.

Figure 7:
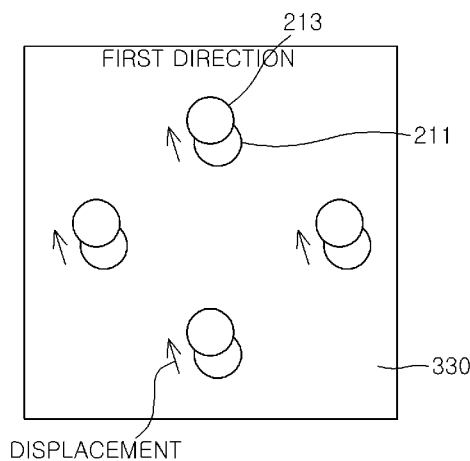
Figure 8:
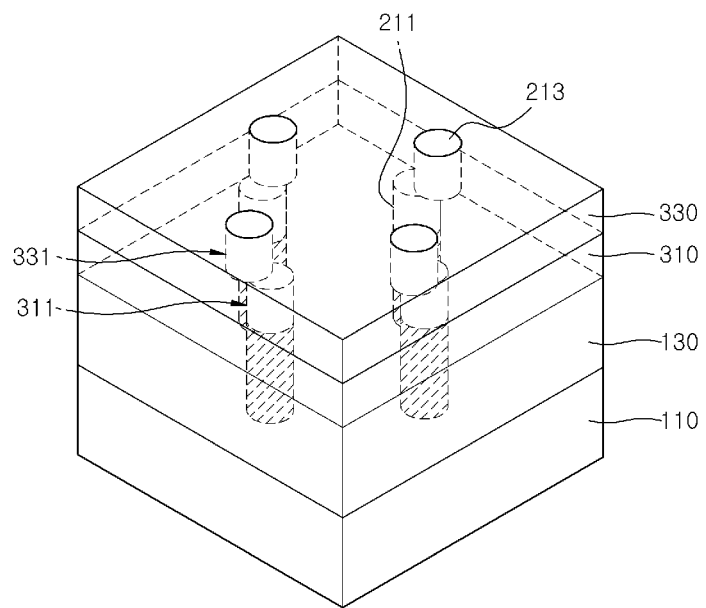

Referring to FIGS. 7 and 8, a second mold layer 330 may be formed on the first mold layer 310 and the first node stairs 211. The second mold layer 330 may be formed to include an insulation material such as a silicon oxide layer. The second mold layer 330 may also be used as a sacrificial layer removed in a subsequent process. The second mold layer 330 may be formed of the same material as the first mold layer 310. Alternatively, the second mold layer 330 may be formed of an insulation material having an etch selectivity with respect to the first mold layer 310. In such a case, while the second mold layer 330 is patterned to form second through holes 331 exposing respective ones of the first node stairs 211, the first mold layer 310 may act as an etch top layer. That is, the first mold layer 310 may be un-recessed even though the first mold layer 310 is exposed during formation of the second through holes 331. In an embodiment, when the first mold layer 310 is formed of a silicon oxide layer, the second mold layer 330 may be formed to include an insulation material (e.g., a silicon nitride layer) having an etch selectivity with respect to the first mold layer 310.

The second through holes 331 may be formed to expose respective ones of the first node stairs 211. Further, each of the second through holes 331 may be formed at a position which is laterally displaced from the corresponding first through holes 311 along an imaginary spiral line that forms a spiral axis (200 of FIGS. 1 and 2), where the imaginary spiral line that forms the spiral axis vertically extends from the semiconductor substrate 110. That is, the spiral axis may project outward from the substrate 110 in an upright manner. Because each of the second through holes 331 may be formed at a position which is laterally displaced from the corresponding first through holes 311, each of the second through holes 331 may be formed to expose a portion of the first mold layer 310.

Second node stairs 213 may be formed in respective ones of the second through holes 331. In an embodiment, the second node stairs 213 may be formed by depositing a conductive layer in the second through holes 331 and on the second mold layer 330, and by planarizing the conductive layer to expose a top surface of the second mold layer 330. Accordingly, each of the second node stairs 213 may be formed to overlap with a portion of the corresponding first node stair 211 when viewed from a plan view. That is, a step may be formed between the first node stair 211 and the second node stair 213 stacked on the first node stair 211.

In an embodiment, the second node stairs 213 may be shifted and/or displaced from respective ones of the first node stairs 211 in a first direction or a predetermined direction (i.e., a same direction), for example, in a clockwise direction when viewed from a plan view. The second node stairs 213 may be formed to include the same material as the first node stairs 211, but is not limited thereto. For example, in some embodiments, the second node stairs 213 may be formed to include a different material from the first node stairs 211.

Figure 9:
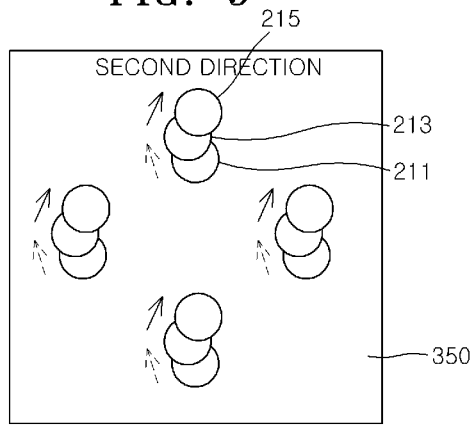
Figure 10:
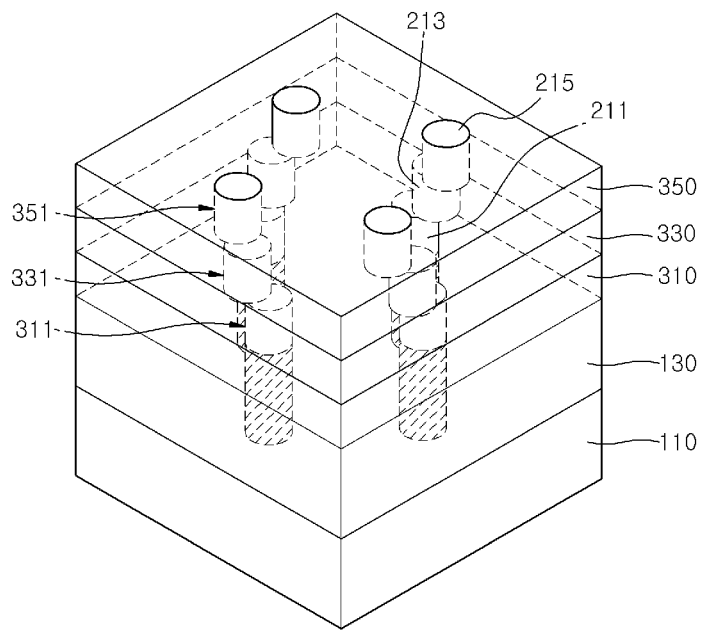

Referring to FIGS. 9 and 10, a third mold layer 350 may be formed on the second mold layer 330 and the second node stairs 213. The third mold layer 350 may be formed of an insulation material such as a silicon oxide layer and may be used as a sacrificial layer like the second mold layer 330. The third mold layer 350 may be formed of the same material (e.g., a silicon nitride layer) as the second mold layer 330. Alternatively, the third mold layer 350 may be formed of a material layer having an etch selectivity with respect to the second mold layer 330. In such a case, while the third mold layer 350 is patterned to form third through holes 351, the second mold layer 330 may act as an etch top layer. That is, the second mold layer 330 may be un-recessed even though the second mold layer 330 is exposed during formation of the third through holes 351. In an embodiment, when the second mold layer 330 is formed of a silicon nitride layer, the third mold layer 350 may be formed to include an insulation material (e.g., a silicon oxide layer) having an etch selectivity with respect to the second mold layer 330.

The third through holes 351 may be formed to expose respective ones of the second node stairs 213. Further, each of the third through holes 351 may be formed at a position which is laterally displaced from the corresponding second through holes 331 along an imaginary spiral line (200 of FIGS. 1 and 2). Thus, each of the third through holes 351 may be formed to expose a portion of the second mold layer 330.

Third node stairs 215 may be formed in respective ones of the third through holes 351. In an embodiment, the third node stairs 215 may be formed by depositing a conductive layer in the third through holes 351 and on the third mold layer 350, and by planarizing the conductive layer to expose a top surface of the third mold layer 350. Accordingly, each of the third node stairs 215 may be formed to overlap with a portion of a corresponding second node stair 213 in a plan view. That is, a step may be formed between second node stairs 213 and third node stairs 215 stacked on respective second node stairs 213.

In an embodiment, the third node stairs 215 may be shifted and/or displaced from respective ones of the second node stairs 213 in a second direction or a predetermined direction (i.e., a same direction), for example, in a clockwise direction when viewed from a plan view. The third node stairs 215 may be formed to include the same material as the first or second node stairs 211 or 213, but not limited thereto. For example, in some embodiments, the third node stairs 215 may be formed to include a different material from the first or second node stairs 211 or 213.

Referring to FIGS. 11 and 12, the process steps illustrated in FIGS. 5 to 10 may be sequentially and repeatedly performed to form spiral storage nodes 210 on respective ones of the contact plugs 150. That is, the spiral storage nodes 210 may be formed by sequentially and repeatedly performing the process steps of forming the first molding layer 310, the first node stairs 211, the second molding layer 330, the second node stairs 213, the third molding layer 350 and the third node stairs 215. As a result, the first to third node stairs 211, 213 and 215 constituting each of the storage nodes 210 may be vertically stacked along the spiral line (200 of FIGS. 1 and 2) to form steps therebetween. Accordingly, each of the spiral storage nodes 210 may be formed to have a step shape.

After forming the stepped spiral storage nodes 210, a mold layer including the first to third mold layers 310, 330 and 350 may be selectively removed to expose outer sidewall surfaces of the storage nodes 210. A configuration of these storage nodes 210 may be formed to have a spiral shape, as illustrated in FIG. 2. Thus, each of the spiral storage nodes 210 may have a greater surface area as compared to a pillar-shaped storage node that extends straightly in a limited height. Further, the steps between the node stairs 211, 213 and 215 may further increase the surface areas of each of the spiral storage nodes 210.

Referring to FIG. 13, a dielectric layer 230 may be formed on the exposed surfaces of the storage nodes 210. The dielectric layer 230 may be formed to include a high-k dielectric layer, for example, a zirconium oxide ($ZrO_2$) layer, an aluminum oxide ($AlO_2$) layer, a tantalum oxide ($TaO_2$) layer or a combination thereof. Subsequently, a plate electrode 250 may be formed on the dielectric layer 230 to complete cell capacitors. The plate electrode 250 may be formed to include a metal layer, a metal nitride layer, a conductive metal oxide layer or a combination thereof. The metal layer may be one of a tantalum (Ta) layer, a zirconium (Zr) layer, a tungsten (W) layer, a ruthenium (Ru) layer, an iridium (Ir) layer, a platinum (Pt) layer and a strontium (Sr) layer.

As describe above, since each of the storage nodes 210 may be formed to have a stepped spiral shape, a surface area of each storage node 210 may be increased without increasing the height of each storage node 210. Thus, capacitance of the cell capacitors can be increased even without an increase in the height of each the storage nodes 210. In other words, the height of the storage nodes 210 can be lowered without reduction of the capacitance of the cell capacitors, thereby reduce a step difference between the cell array region and the peripheral circuit region. This may lead to increase of process margin.

Figure 14:
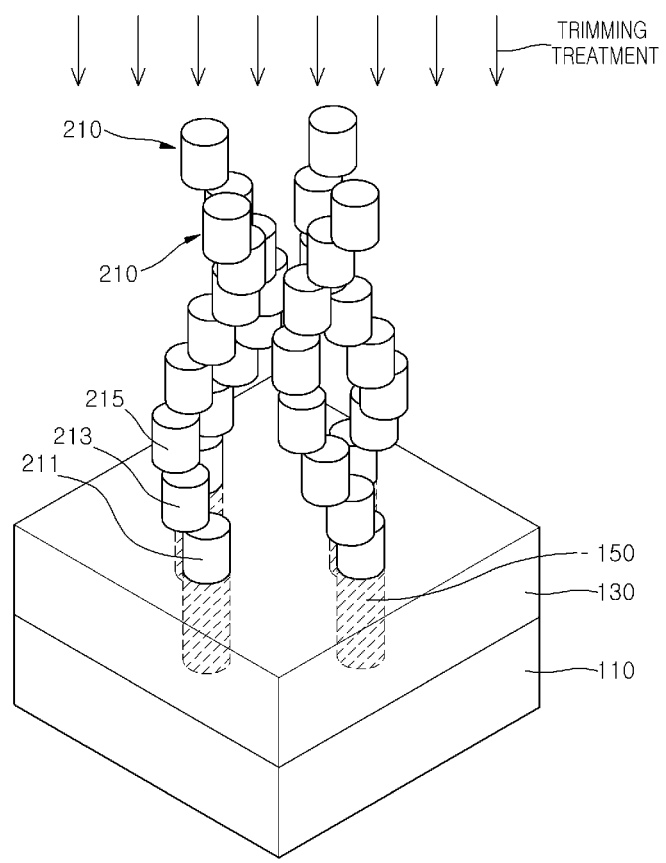
FIGS. 14 and 15 are perspective views illustrating storage nodes of capacitors of a semiconductor device according to another embodiment.
Figure 15:
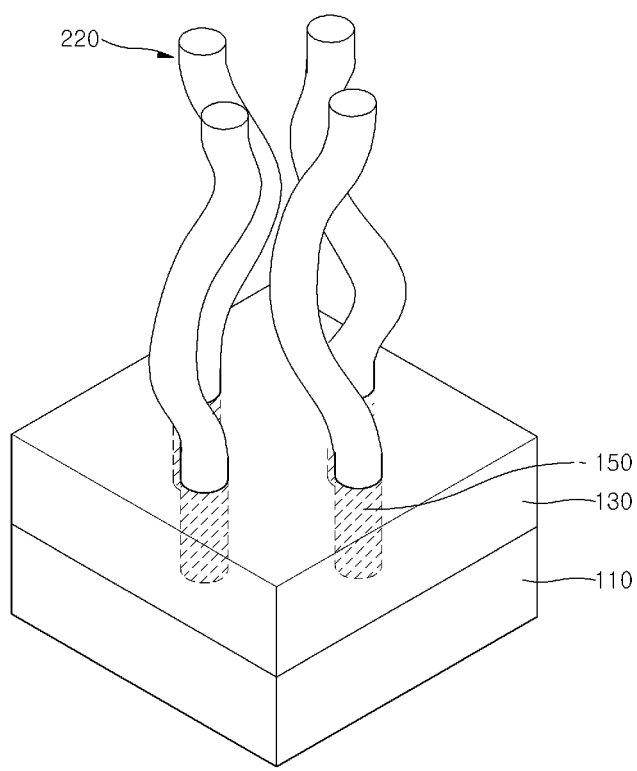

Referring again to FIG. 12, each of the storage nodes 210 may be formed to include steps between the node stairs 211, 213 and 215. However, according to some embodiments, a trimming treatment may be applied to the stepped spiral storage nodes 210, as illustrated in FIG. 14. As a result of the trimming treatment, the stepped spiral storage nodes 210 may be formed into spiral storage nodes 220 having smooth surface profiles, as illustrated in FIG. 15. That is, the trimming treatment may remove the stepped and sharp surfaces of the storage nodes 210. The trimming treatment may be performed using an etching process, for example, a wet etching process utilizing a wet etchant. In some embodiments, the trimming treatment may be performed using an isotropic dry etching process or a plasma etching process. In the event that the trimming treatment is applied to the stepped spiral storage nodes 210, the stepped and sharp surfaces of the stepped spiral storage nodes 210 can be removed to form the spiral storage nodes 220. Therefore, the dielectric layer 230 on the spiral storage nodes 220 may exhibit an excellent leakage current characteristic.

Figure 16:
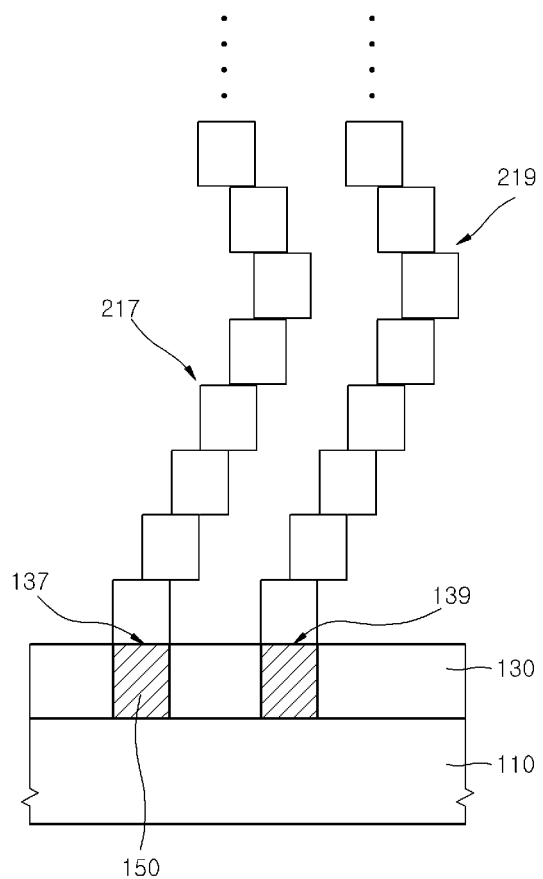
FIG. 16 is a perspective view illustrating storage nodes of capacitors of a semiconductor device according to still another embodiment.

As illustrated in FIG. 16, a first spiral storage node 217 connected to a first connection position 137 of a first contact plug 150 may extend over a second connection position 139 of a second contact plug 150 adjacent to the first contact plug 150. That is, a portion of the first spiral storage node 217 connected to the first contact plug 150 may overlap with the second contact plug 150 adjacent to the first contact plug 150 when viewed from a plan view. However, a second spiral storage node 219 connected to the second connection position 139 may also be twisted along the same direction at corresponding heights as the first spiral storage node 217. Thus, a distance between two adjacent spiral storage nodes 217 and 219 may be uniform at all levels. That is, the first and second spiral storage nodes 217 and 219 may not be electrically connected to each other even though the first and second spiral storage nodes 217 and 219 appear to overlap with each other in a plan view. Accordingly, the surface area of each of the spiral storage nodes 217 and 219 may depend on a radius (or a diameter) of the spiral lines (see the reference numeral 200 of FIGS. 1 and 2) along which the spiral storage nodes 217 and 219 extend. Consequently, if the radius (or a diameter) of the spiral lines 200 along which the spiral storage nodes 217 and 219 extend, the capacitance of the cell capacitors including the spiral storage nodes 217 and 219 may increase without any electrical shortage between the spiral storage nodes 217 and 219.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
    spiral storage nodes disposed on a semiconductor substrate to vertically extend along spiral lines;
    a dielectric layer on the spiral storage nodes; and
    a plate node formed on the dielectric layer of the spiral storage nodes.

2. The semiconductor device of claim 1, further comprising:
    an interlayer insulation layer between the semiconductor substrate and the spiral storage nodes; and
    contact plugs penetrating the interlayer insulation layer to electrically connect the spiral storage nodes with the semiconductor substrate.

3. The semiconductor device of claim 1:
wherein the spiral storage nodes include a first spiral storage node and a second spiral storage node which are spaced apart from each other; and
wherein at least a portion of the first spiral storage node overlaps with a portion of the second spiral storage node when viewed from a plan view.

4. The semiconductor device of claim 1:
wherein the spiral storage nodes include a first spiral storage node and a second spiral storage node which are spaced apart from each other; and
wherein the first spiral storage node and the second spiral storage node are twisted along the same direction at corresponding heights.

5. A semiconductor device comprising:
spiral storage nodes on a semiconductor substrate, each of the spiral storage nodes including a plurality of node stairs stacked along an imaginary spiral line vertically extending from a surface of the semiconductor substrate;
a dielectric layer on the spiral storage nodes; and
a plate node formed on the dielectric layer of the spiral storage nodes.

6. The semiconductor device of claim 5, further comprising:
an interlayer insulation layer between the semiconductor substrate and the spiral storage nodes; and
contact plugs penetrating the interlayer insulation layer to electrically connect the spiral storage nodes to the semiconductor substrate.

7. The semiconductor device of claim 5:
wherein the spiral storage nodes include a first spiral storage node and a second spiral storage node which are spaced apart from each other; and
wherein at least a portion of the first spiral storage node overlaps with a portion of the second spiral storage node when viewed from a plan view.

8. The semiconductor device of claim 5:
wherein the node stairs of each of the spiral storage nodes include a first node stair located at a first level and a second node stair located at a second level higher than the first level; and
wherein the second node stairs of the spiral storage nodes are shifted or displaced from respective ones of the first node stairs in the same direction when viewed from a plan view.

* * * * *